US008956945B2

(12) United States Patent
Dunn et al.

(10) Patent No.: US 8,956,945 B2
(45) Date of Patent: Feb. 17, 2015

(54) TRENCH ISOLATION FOR BIPOLAR JUNCTION TRANSISTORS IN BICMOS TECHNOLOGY

(71) Applicant: International Business Machines Corporation, Armonk, NY (US)

(72) Inventors: James S. Dunn, Jericho, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/757,961

(22) Filed: Feb. 4, 2013

(65) Prior Publication Data

US 2014/0217551 A1    Aug. 7, 2014

(51) Int. Cl.
H01L 21/331    (2006.01)
G06F 17/50    (2006.01)
H01L 29/66    (2006.01)
H01L 29/737    (2006.01)
H01L 29/06    (2006.01)

(52) U.S. Cl.
CPC ...... *G06F 17/5045* (2013.01); *H01L 29/66242* (2013.01); *H01L 29/7378* (2013.01); *H01L 29/0649* (2013.01)
USPC ............ 438/359; 438/422; 257/E21.608

(58) Field of Classification Search
USPC .......... 438/318, 319, 343, 353, 359, 422
See application file for complete search history.

(56) References Cited

U.S. PATENT DOCUMENTS

| 4,484,244 | A  | 11/1984 | Avery |
| 4,885,614 | A  | 12/1989 | Furukawa et al. |
| 5,242,843 | A  | 9/1993  | Aina |
| 5,780,905 | A  | 7/1998  | Chen et al. |
| 6,011,681 | A  | 1/2000  | Ker et al. |
| 6,258,634 | B1 | 7/2001  | Wang et al. |
| 6,365,924 | B1 | 4/2002  | Wang et al. |
| 6,531,369 | B1 | 3/2003  | Ozkan et al. |
| 6,566,273 | B2 | 5/2003  | Kudelka |
| 6,750,484 | B2 | 6/2004  | Lippert et al. |
| 6,767,798 | B2 | 7/2004  | Kalnitsky et al. |
| 6,784,029 | B1 | 8/2004  | Vashchenko et al. |
| 6,809,024 | B1 | 10/2004 | Dunn et al. |
| 6,812,545 | B2 | 11/2004 | Dunn et al. |
| 6,864,560 | B2 | 3/2005  | Khater et al. |
| 6,869,852 | B1 | 3/2005  | Joseph et al. |
| 6,888,221 | B1 | 5/2005  | Joseph et al. |
| 6,906,357 | B1 | 6/2005  | Vashchenko et al. |
| 6,933,540 | B2 | 8/2005  | Liu et al. |

(Continued)

OTHER PUBLICATIONS

Camillo-Castillo et al., U.S. Appl. No. 13/758,204 entitled Bipolar Junction Transistors With a Link Region Connecting the Intrinsic and Extrinsic Bases, filed Feb. 4, 2013.

(Continued)

*Primary Examiner* — Chandra Chaudhari
(74) *Attorney, Agent, or Firm* — Wood, Herron & Evans LLP; Anthony J. Canale

(57) ABSTRACT

Device structures, fabrication methods, and design structures for a bipolar junction transistor. A first isolation structure is formed in a substrate to define a boundary for a device region. A collector is formed in the device region, and a second isolation structure is formed in the device region. The second isolation structure defines a boundary for the collector. The second isolation structure is laterally positioned relative to the first isolation structure to define a section of the device region between the first and second isolation structures.

12 Claims, 9 Drawing Sheets

(56) References Cited

U.S. PATENT DOCUMENTS

| | | |
|---|---|---|
| 6,936,910 B2 | 8/2005 | Ellis-Monaghan et al. |
| 6,940,149 B1 | 9/2005 | Divakaruni et al. |
| 6,960,792 B1 | 11/2005 | Nguyen |
| 6,964,883 B2 | 11/2005 | Chang |
| 6,964,907 B1 | 11/2005 | Hopper et al. |
| 6,972,443 B2 | 12/2005 | Khater |
| 7,002,221 B2 | 2/2006 | Khater et al. |
| 7,019,341 B2 | 3/2006 | Lippert et al. |
| 7,034,363 B2 | 4/2006 | Chen |
| 7,087,940 B2 | 8/2006 | Khater et al. |
| 7,145,187 B1 | 12/2006 | Vashchenko et al. |
| 7,196,361 B1 | 3/2007 | Vashchenko et al. |
| 7,253,096 B2 | 8/2007 | Khater et al. |
| 7,262,484 B2 | 8/2007 | Dunn et al. |
| 7,327,541 B1 | 2/2008 | Wang et al. |
| 7,371,650 B2 | 5/2008 | Bock et al. |
| 7,394,133 B1 | 7/2008 | Vashchenko et al. |
| 7,427,787 B2 | 9/2008 | Steinhoff |
| 7,462,547 B2 | 12/2008 | Akatsu et al. |
| 7,489,359 B2 | 2/2009 | Fukumoto et al. |
| 7,566,914 B2 | 7/2009 | Salcedo et al. |
| 7,612,430 B2 | 11/2009 | Franosch et al. |
| 7,639,464 B1 | 12/2009 | Vashchenko et al. |
| 7,719,088 B2 | 5/2010 | Bock et al. |
| 7,776,704 B2 | 8/2010 | Dunn et al. |
| 7,842,971 B2 | 11/2010 | Liu et al. |
| 7,888,745 B2 | 2/2011 | Khater et al. |
| 7,915,638 B2 | 3/2011 | Tseng et al. |
| 7,932,541 B2 | 4/2011 | Joseph et al. |
| 7,936,030 B2 | 5/2011 | Kim et al. |
| 7,995,316 B2 | 8/2011 | Carpenter, Jr. et al. |
| 8,020,128 B2 * | 9/2011 | Joseph et al. ............... 716/110 |
| 8,035,190 B2 | 10/2011 | Liu et al. |
| 8,039,868 B2 | 10/2011 | Gauthier, Jr. et al. |
| 8,101,491 B2 | 1/2012 | Donkers et al. |
| 8,338,863 B2 | 12/2012 | Camillo-Castillo et al. |
| 2002/0090788 A1 | 7/2002 | U'ren |
| 2002/0117733 A1 | 8/2002 | Racanelli |
| 2004/0188797 A1 | 9/2004 | Khater et al. |
| 2005/0212087 A1 | 9/2005 | Akatsu et al. |
| 2005/0236647 A1 | 10/2005 | Khater |
| 2006/0113634 A1 | 6/2006 | Ahmed et al. |
| 2007/0126080 A1 | 6/2007 | Wallner et al. |
| 2007/0166900 A1 | 7/2007 | Li et al. |
| 2008/0179632 A1 | 7/2008 | Adam et al. |
| 2008/0179715 A1 | 7/2008 | Coppa |
| 2009/0101942 A1 | 4/2009 | Dyer |
| 2009/0179228 A1 | 7/2009 | Joseph et al. |
| 2010/0193835 A1 | 8/2010 | Hshieh |
| 2012/0098039 A1 | 4/2012 | Miu et al. |
| 2012/0112244 A1 | 5/2012 | Camillo-Castillo et al. |
| 2013/0009280 A1 | 1/2013 | Camillo-Castillo et al. |

OTHER PUBLICATIONS

Adkisson, et al., U.S. Appl. No. 13/705,717 entitled Bipolar Junction Transistors With Reduced Base-Collector Junction Capacitance, filed Dec. 5, 2012.

European Patent Office, International Search Report and Written Opinion issued in PCT/US2013/057970 dated Nov. 12, 2013.

Campi, et al. U.S. Appl. No. 13/705,717 entitled Bipolar Junction Transistors With Reduced Base-Collector Junction Capacitance filed Dec. 5, 2012.

Liu, et al., "A dual-polarity SCR for RF IC ESD protection", 2008 International Conference on Communications, Circuits and Systems, Fujian, China, May 25-27, 2008, pp. 1228-1230.

Liu, et al., "An Improved Bidirectional SCR Structure for Low-Triggering ESD Protection Applications", IEEE Electron Device Letters, vol. 29, No. 4, Apr. 2008, pp. 360-362.

Wang, et al., "Cross-Coupling Low-Triggering Dual-Polarity CLTdSCR ESD Protection in CMOS", IEEE Electron Device Letters, vol. 31, No. 10, Oct. 2010, pp. 1143-1145.

Calvin Lee, Examiner, USPTO, Office Action issued in related U.S. Appl. No. 13/177,146 dated Jan. 7, 2013.

"A low-cost fully self-aligned SiGe BiCMOS technology using selective epitaxy and a lateral quasi-single-poly integration concept" Tilke, et al., Electron Devices, IEEE Transactions on, vol. 51, Issue: 7, Publication Year: 2004, pp. 1101-1107.

"Self-aligned bipolar epitaxial base n-p-n transistors by selective epitaxy emitter window (SEEW) technology", Burghartz, J.N. et al., Electron Devices, IEEE Transactions on, vol. 38, Issue: 2, Publication Year: 1991, pp. 378-385.

Harame, et al., "The revolution in SiGe: impact on device electronics", Applied Surface Science 224 (2004) 9-17.

Hall, et al., "Silicon-germanium for ULSI", Journal of Telecommunications and Information Technology, pp. 3-4, 2000.

International Search Report and Written Opinion of the International Searching Authority issued in International application No. PCT/US14/14056 dated May 16, 2014.

\* cited by examiner

TRENCH ISOLATION FOR BIPOLAR JUNCTION TRANSISTORS IN BICMOS TECHNOLOGY

BACKGROUND

The invention relates generally to semiconductor device fabrication and, in particular, to device structures for a bipolar junction transistor, fabrication methods for a bipolar junction transistor, and design structures for a bipolar junction transistor.

Bipolar junction transistors are typically found in demanding types of integrated circuits, especially integrated circuits destined for high-frequency applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices constituted by three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of bipolar junction transistors.

BRIEF SUMMARY

In an embodiment of the invention, a method is provided for fabricating a bipolar junction transistor. The method includes forming a first isolation structure in a substrate to define a lateral boundary for a device region and forming a collector in the device region of the substrate. The method further includes, after the collector is formed, forming a second isolation structure in the device region that is laterally positioned relative to the first isolation structure to define a section of the device region between the first and second isolation structures.

In an embodiment of the invention, a device structure is provided for a bipolar junction transistor. The device structure includes a first isolation structure in a substrate, a device region having a boundary defined by the first isolation structure, a collector in the device region, and a second isolation structure in the device region. The second isolation structure is laterally positioned relative to the first isolation structure to define a section of the device region between the first and second isolation structures.

In an embodiment of the invention, a hardware description language (HDL) design structure is encoded on a machine-readable data storage medium. The HDL design structure comprises elements that, when processed in a computer-aided design system, generates a machine-executable representation of a device structure for a bipolar junction transistor. The HDL design structure includes a first isolation structure in a substrate, a device region having a boundary defined by the first isolation structure, a collector in the device region, and a second isolation structure in the device region. The second isolation structure is laterally positioned relative to the first isolation structure to define a section of the device region between the first and second isolation structures. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
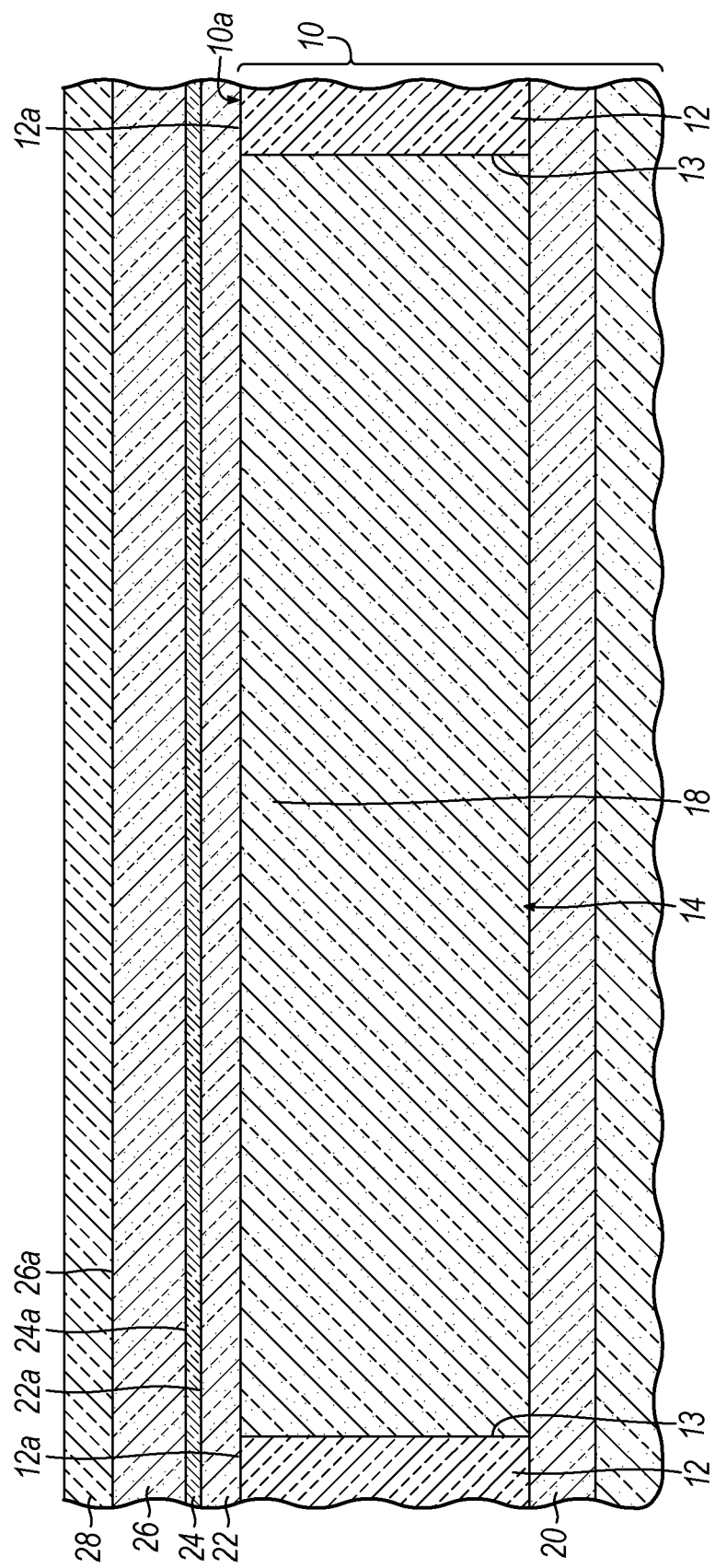
FIGS. 1-8 are cross-sectional views of a portion of a substrate at successive fabrication stages of a processing method for fabricating a device structure in accordance with an embodiment of the invention.
Figure 8:
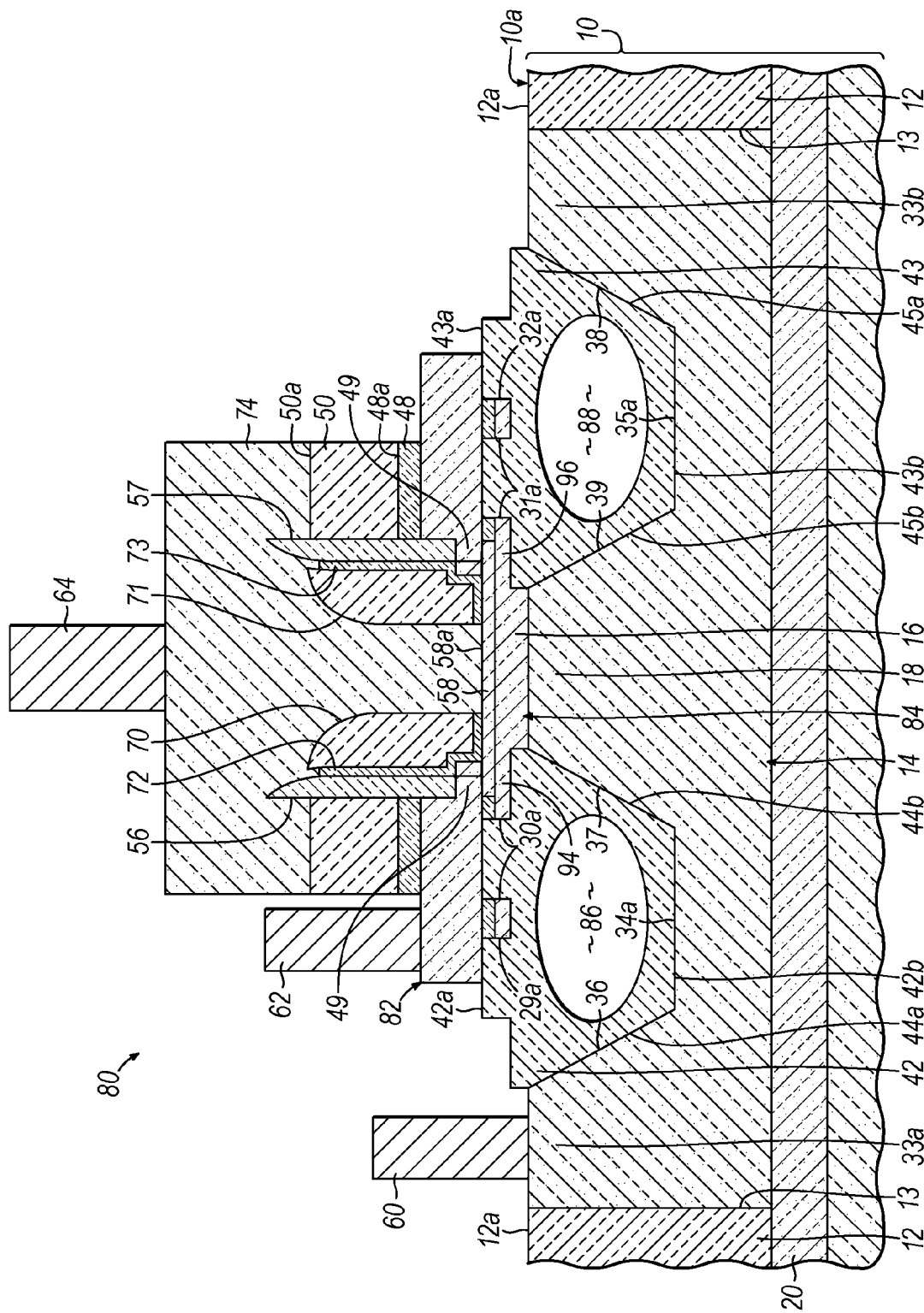

With reference to FIG. 1 and in accordance with an embodiment of the invention, a substrate 10 includes trench isolation structures 12 that circumscribe and electrically isolate a device region 14 used in the fabrication of a bipolar junction transistor 80 (FIG. 8). The substrate 10 may be any suitable bulk substrate comprising a semiconductor material that a person having ordinary skill in the art would recognize as suitable for forming an integrated circuit. For example, substrate 10 may be comprised of a wafer of a single crystal silicon-containing material, such as single crystal silicon with a (100) crystal lattice orientation. The semiconductor material comprising substrate 10 may be lightly doped with an impurity to alter its electrical properties and may also include an optional epitaxial layer. The top surface of the device region 14 is coextensive with a top surface 10a of the substrate 10.

The trench isolation structures 12 may be formed by a shallow trench isolation (STI) technique that relies on a lithography and dry etching process to define closed-bottomed trenches in substrate 10, deposit an electrical insulator to fill the trenches, and planarize the electrical insulator relative to the top surface 10a of the substrate 10 using a chemical mechanical polishing (CMP) process. The electrical insulator may be comprised of an oxide of silicon, such as densified tetraethylorthosilicate (TEOS) deposited by chemical vapor deposition (CVD). The trench isolation structures 12 have a top surface 12a that is nominally coplanar with or slightly below the top surface 10a of the substrate 10.

The device region 14 includes a collector 18 and a subcollector 20 formed as impurity-doped regions of the same conductivity type. A top surface of the collector 18 may be coextensive with the top surface 10a of the substrate 10 and device region 14. The sidewall 13 encircles or surrounds the collector 18 and device region 14 so as to define a lateral boundary for the device region 14. More specifically, the sidewall 13 is an interior surface of the trench isolation structures 12 that is coextensive with the collector 18 and device region 14.

The collector 18 and subcollector 20 may be formed by introducing an impurity species to supply an electrically-active dopant. In one embodiment, the collector 18 and the subcollector 20 may be formed by separate ion implantations of an n-type impurity species from Group V of the Periodic Table (e.g., phosphorus (P), arsenic (As), or antimony (Sb)) effective to impart an n-type conductivity and, thereafter, annealing to activate the impurity species and alleviate implantation damage. The subcollector 20 may be formed by a high-current ion implantation of an n-type impurity species followed by a lengthy, high temperature thermal anneal that dopes a thickness of the substrate 10 before the optional epitaxial layer is formed. The collector 18 may comprise a selectively implanted collector (SIC) formed by ion implantation in the central part of the device region 14 at an appropriate stage of the process flow. During stages of the process flow subsequent to implantation, the dopant in the collector 18 may diffuse laterally and vertically such that substantially the entire central portion of device region 14 becomes impurity doped and, as a result, is structurally and electrically continuous with the subcollector 20.

An intrinsic base layer 22 is formed as a continuous additive layer on the top surface 10a of device region 14. The intrinsic base layer 22 is coupled with the collector 18. The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded and/or stepped across the thickness of intrinsic base layer 22. If the germanium content is stepped, a thickness of the intrinsic base layer 22, such as a thickness directly contacting the collector 18, may not contain any germanium and may be entirely comprised of silicon (Si). The intrinsic base layer 22 may be doped with one or more impurity species, such as boron and/or carbon.

In the representative embodiment, the intrinsic base layer 22 may include sublayers or strata 19, 21 comprised of primarily of silicon that includes a varying germanium content or concentration over different thicknesses in a stepped and/or graded profile. For example, stratum 19, which is adjacent to the collector 18, may be comprised of silicon without a germanium content and/or with less than a threshold concentration of germanium, and stratum 21, which is separated from the collector 18 by the stratum 19, may be comprised of silicon-germanium or silicon-germanium with a higher germanium content than stratum 19.

Intrinsic base layer 22 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) is epitaxially grown or deposited onto any exposed crystalline surface such as the exposed top surface 10a of device region 14. For example, the single-crystal semiconductor material of the device region 14 serves as a crystalline template for the growth of at least the section of intrinsic base layer 22 that is coextensive with the device region 14.

A base dielectric layer 24 is formed on a top surface 22a of intrinsic base layer 22 and, in the representative embodiment, directly contacts the top surface 22a. The base dielectric layer 24 may be comprised of an electrical insulator with a dielectric constant (e.g., a permittivity) characteristic of a dielectric material. In one embodiment, the base dielectric layer 24 may be comprised of a high temperature oxide (HTO) deposited using rapid thermal process (RTP) at temperatures of 500° C. or higher. Alternatively, the base dielectric layer 24 may be comprised of oxide formed by a different deposition process, thermal oxidation of silicon (e.g., oxidation at high pressure with steam (HIPOX)), or a combination of these processes.

A sacrificial layer 26 is deposited on the top surface 24a of the base dielectric layer 24. In a representative embodiment, the sacrificial layer 26 may be comprised of polysilicon or amorphous silicon deposited by CVD using either silane or disilane as a silicon source. A cap layer 28 is applied on a top surface 26a of sacrificial layer 26 and may be comprised of a different material type, e.g., silicon dioxide, than sacrificial layer 26 and that is not etched by the selective etching process applied subsequently in the process flow.

Figure 2:
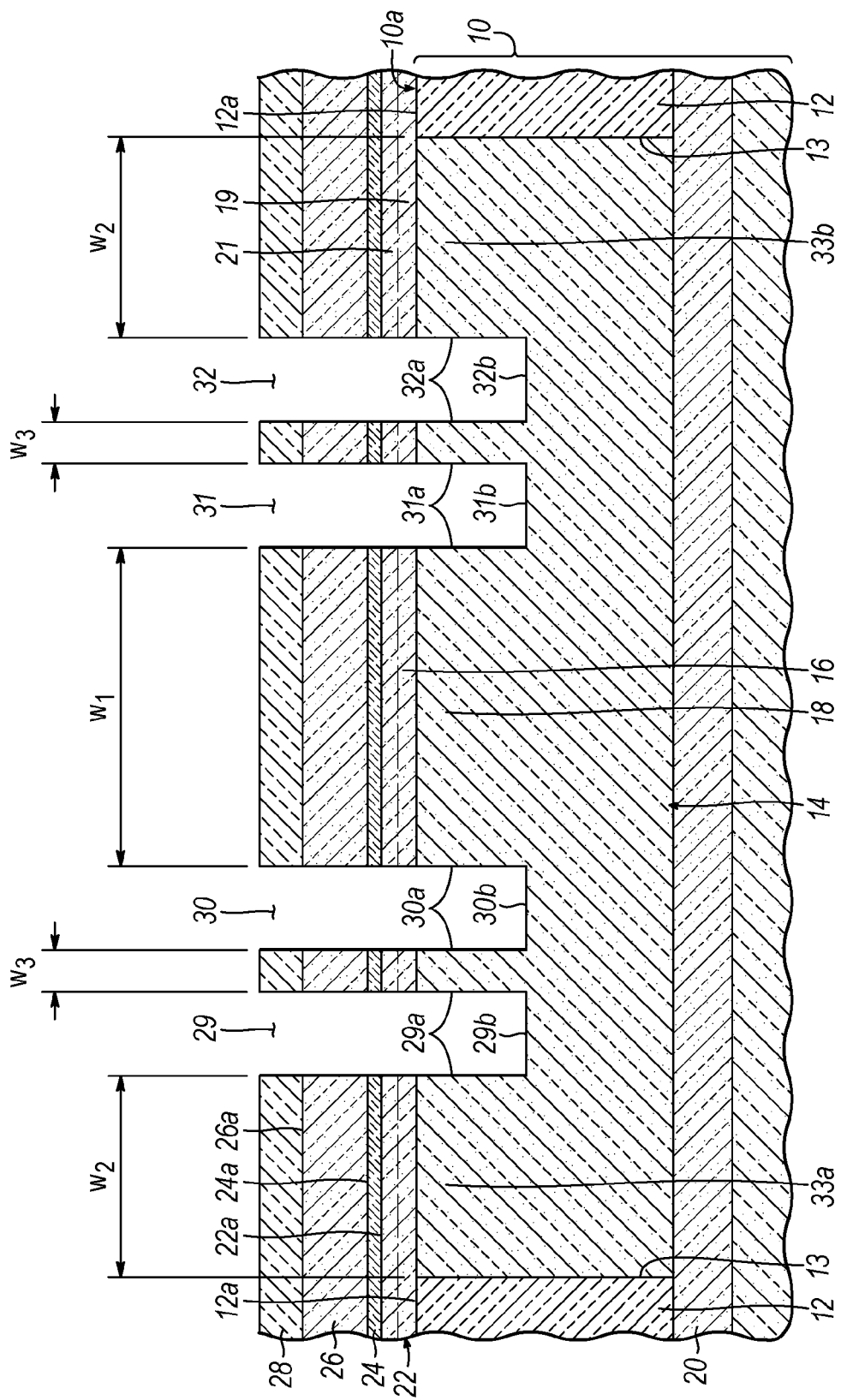

With reference to FIG. 2 in which like reference numerals refer to like features in FIG. 1 and at a subsequent fabrication stage of the processing method, a plurality of trenches 29, 30 and a plurality of trenches 31, 32 are formed that extend from a top surface of the cap layer 28 completely through the cap layer 28, the sacrificial layer 26, the base dielectric layer 24, the intrinsic base layer 22, and into the device region 14. Trench 29 includes sidewalls 29a joined by a bottom surface 29b, trench 30 includes sidewalls 30a joined by a bottom surface 30b, trench 31 includes sidewalls 31a joined by a bottom surface 31b, and trench 32 includes sidewalls 32a joined by a bottom surface 32b. The bottom surfaces 29b, 30b, 31b, 32b are at a shallower depth than the bottom surface of the trench isolation structures 12 relative to the top surface 10a. The sidewalls 29a-32a are oriented with a substantially vertical and parallel alignment, and may be oriented at respective right angles relative (i.e., perpendicular) to the top surface 10a of substrate 10. Additional trenches like trenches 29, 30 and additional trenches like trenches 31, 32 may be provided in each trench group.

The collector 18 is positioned in the device region 14 between the inner trench 30 and the inner trench 31, and is characterized by a width $w_1$. Sections 33a, 33b of the device region 14, which may have the same conductivity type as the collector 18, are disposed between the outer trenches 29, 32 and the sidewall 13 of the trench isolation structures 12. Hence, the collector 18 is positioned between one plurality of trenches 29, 30 and another plurality of trenches 31, 32. Section 33a of the device region 14 is coextensive with the sidewall 13 and with the outer sidewall 29a of trench 29. Section 33b of the device region 14 is coextensive with the sidewall 13 and with the outer sidewall 32a of trench 32. The sections 33a, 33b of the device region 14 are characterized by a width dimension, $w_1$. An interior section 16 of the intrinsic base layer 22, which directly contacts the collector 18 in the representative embodiment, also has the width, $w_1$. The adjacent sidewalls 29a, 30a of trenches 29, 30 are separated by a width, $w_3$, of the material of device region 14. In the representative embodiment, the adjacent sidewalls 31a, 32a of trenches 31, 32 are also separated by the width, $w_3$, of the material of device region 14. The vertical layer stack of the cap layer 28, sacrificial layer 26, base dielectric layer 24, and intrinsic base layer 22 located between the trenches 29, 30 is a beam supported at its opposite ends.

In one embodiment, the trenches 29-32 may comprise linear open volumes that are aligned parallel to each other and separated by strips of semiconductor material of the device region 14. In an alternative embodiment, trenches 29, 32 may be omitted and trenches 30, 31 may be joined at one end by an additional trench.

The trenches 29-32 may be formed using a photolithography process and a non-selective etching process. To that end, a mask layer (not shown) may be applied on the top surface of the cap layer 28. The mask layer may comprise a photoresist that is applied as a layer by a spin coating process, pre-baked, exposed to a radiation projected through a photomask, baked after exposure, and developed with a chemical developer to form an etch mask that includes a pattern of openings coinciding with the intended locations of the trenches 29-32. The pattern of openings is transferred from the mask layer to the sacrificial layer 26, the base dielectric layer 24, the intrinsic base layer 22, and the collector 18 to define the trenches 29-32 by the non-selective etching process. The non-selective etching process may comprise a wet etching process or a dry etching process, such as reactive-ion etching (RIE) that produces vertical sidewalls 29a-32a. The non-selective etching process, which may be conducted in a single etching step or multiple steps, relies on one or more etch chemistries that remove the materials of the cap layer 28, the sacrificial layer 26, the base dielectric layer 24, the intrinsic base layer 22, and the collector 18, and may comprise a timed etch. The mask layer is removed in response to forming the trenches 29-32. If comprised of a photoresist, the mask layer may then be removed by ashing or solvent stripping, followed by a conventional cleaning process.

When formed, the substrate 10 may be rotationally oriented in the lithography tool used to pattern the mask layer in the photolithography process using a feature on the substrate, such as a notch at a peripheral edge, as an angular reference. Alignment marks on the substrate 10 and photomask may also be aligned in the photolithography tool to assist in rotationally orienting the substrate 10. The openings subsequently formed in the patterned mask layer are aligned with a crystallographic plane or orientation of the crystalline semiconductor material of substrate 10. For example, the openings may be oriented parallel to the [100] directions of a single crystal silicon substrate. The preferential alignment is transferred by the etching process from the openings in the mask to the portion of the trenches 29-32 in the device region 14. In particular, the trench sidewalls 29a-32a are each aligned with a crystallographic plane or orientation of the crystalline semiconductor material of substrate 10.

Figure 3:
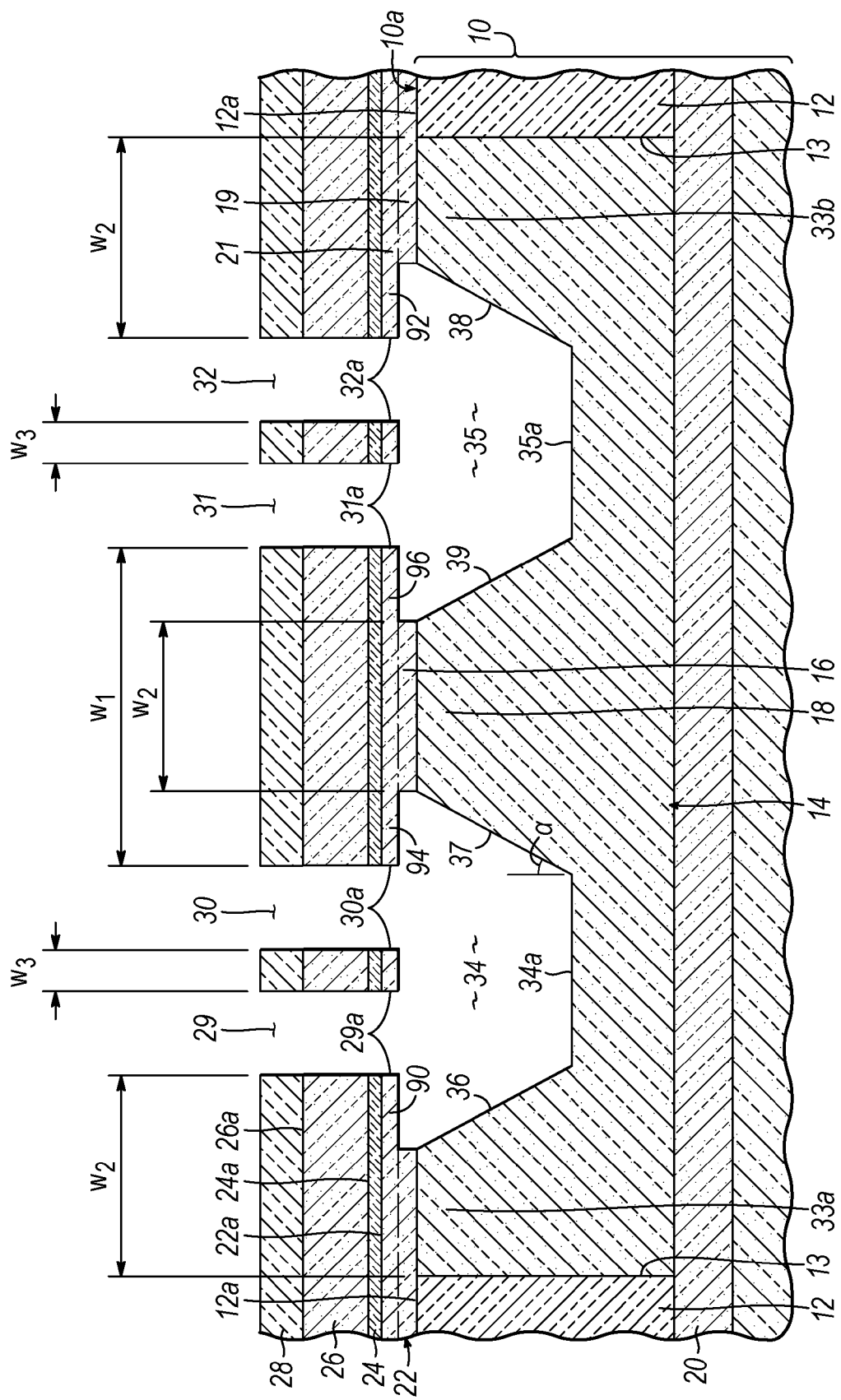

With reference to FIG. 3 in which like reference numerals refer to like features in FIG. 2 and at a subsequent fabrication stage of the processing method, trenches 34, 35 are formed in the device region 14 by modifying the sections of trenches 29-32 within the device region 14. Specifically, trenches 29, 30 are enlarged and coalesced by etching the semiconductor material of device region 14 bordering trenches 29, 30 (FIG. 2) to define trench 34, and trenches 31, 32 are enlarged and coalesced by etching the semiconductor material of device region 14 bordering trenches 31, 32 (FIG. 2) to define trench 35. Trenches 34, 35 are wider than the residual sections of trenches 29-32 remaining in the intrinsic base layer 22.

Trench 34 includes an exterior sidewall 36 and an interior sidewall 37 in the device region 14 that are continuous with the residual sections of trenches 29, 30 in the intrinsic base layer 22. Trench 35 includes an exterior sidewall 38 and an interior sidewall 39 in the device region 14 that are continuous with the residual sections of trenches 31, 32 in the intrinsic base layer 22. Trenches 34, 35 surround the collector 18 and, more specifically, sidewalls 37, 39 are coextensive with (i.e., define a lateral boundary of) the collector 18. Sidewalls 36-39 have a non-perpendicular (i.e., inclined) orientation relative to the top surface 10a. In particular, each of the sidewalls 36-39 becomes inclined at an angle, α, relative to the top surface 10a of substrate 10 and relative to the sidewalls 29a-32a of the sections of trenches 29-32 that remain in the intrinsic base layer 22. The original depth of the trenches 29-32 may be slightly increased by the anisotropic etching process because the semiconductor material bordering the bottom surfaces 29b-32b (FIG. 3) may be aligned with a crystallographic plane or orientation that etches with a considerably slower etch rate than the semiconductor material bordering the sidewalls 29a-32a. As a result, the bottom surfaces 34a, 35a may be slightly deeper than the bottom surfaces 29b-32.

The trenches 34, 35 may be created with an orientation-dependent etching process, called an anisotropic etching process herein, that may have different etch rates for different crystallographic directions in a semiconductor and/or that may have different etch rates for semiconductors of different doping or different compositions. The anisotropic etching process etches the semiconductor material of the device region 14 bordering the sidewalls 29a-32a of trenches 29-32 (FIG. 3) in all crystallographic directions, but at significantly different etching rates for different crystal directions or planes. For example, silicon etching in tetramethylammonium hydroxide (TMAH) is relatively slow for (111) crystal planes compared to other directions, such as (100) planes or (110) planes. Therefore, the etch pattern formed by the anisotropic etching process proceeds along the crystal planes of higher etching rate and is eventually terminated by the crystal planes of lower etching rate. The absolute etch rates in each crystallographic direction and the relative etch rate in different crystallographic directions may be dependent upon factors such as solution strength (i.e., concentration) and solution temperature of the etchant. The etch time for exposure to the etchant may be selected to be adequate to produce a targeted change in sidewall geometrical shape. In one embodiment, the anisotropic etching process may be a wet chemical etching process that uses an etchant comprising TMAH, ammonium hydroxide ($NH_4OH$), ethylenediamine pyrocatechol (EDP), or potassium hydroxide (KOH).

In a representative embodiment in which the substrate 10 is single crystal silicon having a [100] surface normal and the trenches 29-32 in the device region 14 are aligned with a [100] direction, the sidewalls 29a-32a are aligned with crystallographically equivalent (110) planes before the anisotropic etching process is performed. After a given timed etch, the sidewalls 36-39 of the trenches 34, 35 may be inclined at a nominal angle, α, of 45° relative to the top surface 10a.

The anisotropic etching process removes the semiconductor material of the device region 14 of substrate 10 at a considerably higher rate than the semiconductor material comprising at least a portion of the intrinsic base layer 22 and at a considerably higher rate than the electrical insulators comprising the base dielectric layer 24 and trench isolation structures 12. In the representative embodiment, the intrinsic base layer 22 includes strata 19, 21 of different compositions, and the material of stratum 19 has a higher etch rate than stratum 21 and stratum 21 is not etched or minimally etched, and the sections 90, 92, 94, 96 may reflect removal of stratum 19 and the non-removal or minimal removal of stratum 21. Because of the etch selectivity, the sidewalls 29a-32a of trenches 29-32 each extending through the intrinsic base layer 22 may nominally retain their original separation, and remain nominally vertical and perpendicular to the top surface 10a.

Sections 90, 92 of the intrinsic base layer 22 are undercut by the partial removal of the device region 14 and, depending on the composition (e.g., silicon without added germanium over a thickness adjacent to the collector 18), the partial removal of the intrinsic base layer 22. The undercutting reduces the distance between the interior sidewalls 37, 39 so that a width, $w_4$, of the collector 18 laterally between the interior sidewalls 37, 39 and proximate to the intrinsic base layer 22 is reduced in comparison with the initial width, $w_3$. Similarly, sections 94, 96 of the intrinsic base layer 22 are undercut by the selective etching that supplies the inclination of the interior sidewalls 36, 38. At least a portion of the interior section 16 of the intrinsic base layer 22 retains the width, $w_1$, which is greater than the width, $w_4$. Assuming equivalent lengths for the interior section 16 of the intrinsic base layer 22 and the collector 18, then the area of the interior section 16 of the intrinsic base layer 22 is larger than the confronting area of the collector 18.

Figure 4:
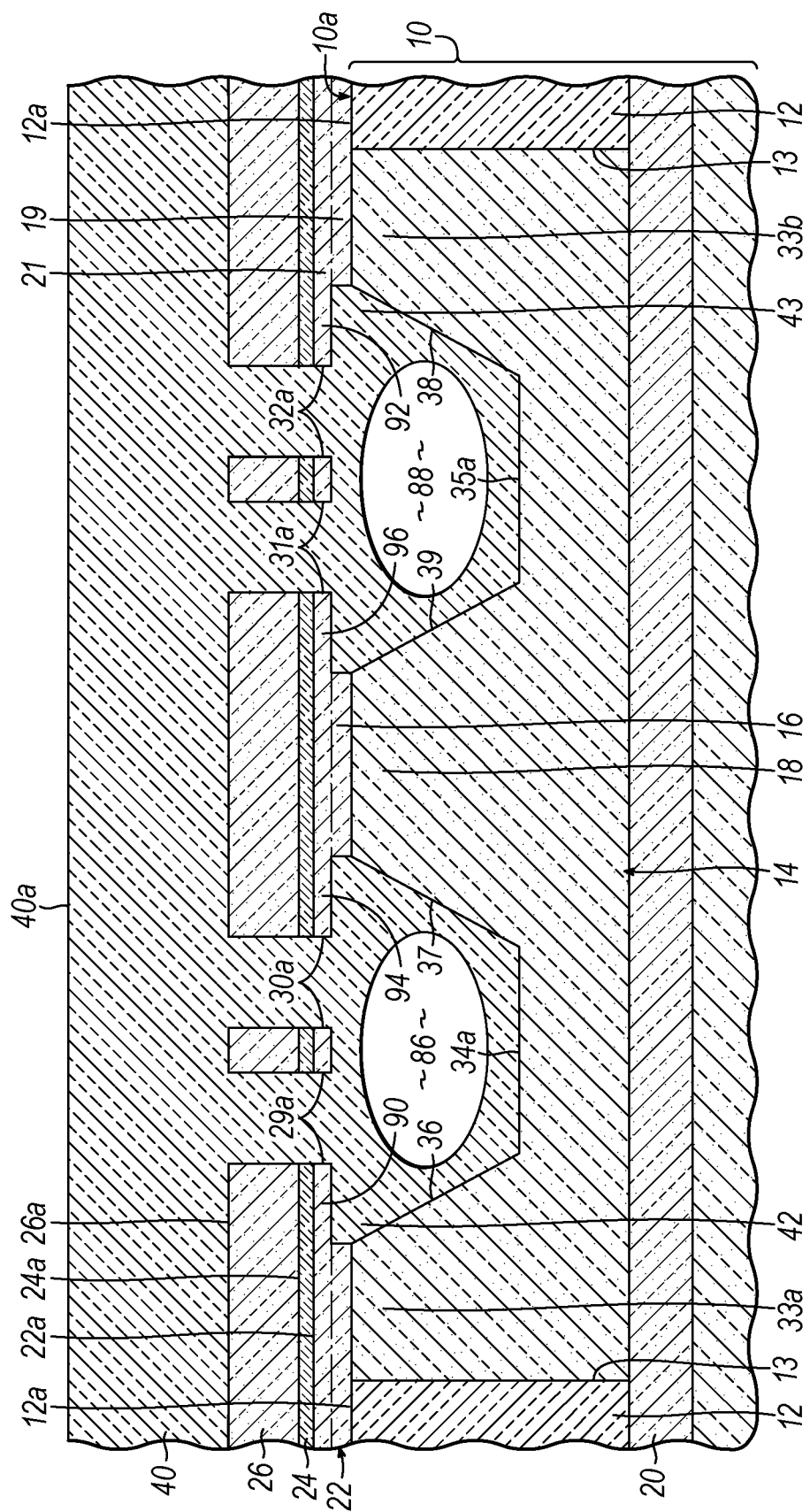

With reference to FIG. 4 in which like reference numerals refer to like features in FIG. 3 and at a subsequent fabrication stage of the processing method, isolation structures 42, 43 comprised of an electrical insulator are formed in the trenches 34, 35. To that end, a dielectric layer 40 is applied that fills the trenches 34, 35 respective portions of the electrical insulator. The dielectric layer 40 also deposits on the top surface 26a of the sacrificial layer 26. The dielectric layer 40 may comprise any suitable organic or inorganic dielectric material, which may be an electrical insulator characterized by an electrical resistivity at room temperature of greater than $10^{10}(\Omega\text{-m})$. Candidate inorganic dielectric materials for dielectric layer 40 may include, but are not limited to, silicon dioxide ($SiO_2$), fluorine-doped silicon glass (FSG), and combinations of these dielectric materials. Alternatively, dielectric layer 40 may comprise a low-k dielectric material characterized by a relative permittivity or dielectric constant smaller than the $SiO_2$ dielectric constant of approximately 3.9. Candidate low-k dielectric materials for dielectric layer 40 include, but are not limited to, porous and nonporous spun-on organic low-k dielectrics, such as spin-on spun-on aromatic thermoset polymer resins like polyarylenes, porous and nonporous inorganic low-k dielectrics, such as organosilicate glasses, hydrogen-enriched silicon oxycarbide (SiCOH), and carbon-doped oxides, and combinations of these and other organic and inorganic dielectrics. Dielectric layer 40 may be deposited by any number of techniques including, but not limited to, sputtering, spin-on application, or CVD.

In one specific embodiment, the dielectric layer 40 may be comprised of an oxide of silicon (e.g., $SiO_2$) that may be deposited by low pressure chemical vapor phase deposition (LPCVD) using a silicon source of either silane or a mixture of silane with nitrogen. For example, the substrate temperature during LPCVD may range from 600° C. to 650° C. and the process chamber pressure during LPCVD may be constrained in a range between 25 Pa and 150 Pa.

In the representative embodiment, isolation structures 42, 43 may include subsurface voids 86, 88 that are introduced into the constituent dielectric material during deposition. The subsurface voids 86, 88 operate to lower the composite dielectric constant of the dielectric material comprising isolation structures 42, 43. The subsurface voids 86, 88 each represent one or more empty spaces devoid of solid matter. The subsurface voids 86, 88 may have an effective dielectric constant of approximately unity (about 1.0) and may be filled by air at or near atmospheric pressure, filled by another gas at or near atmospheric pressure, or contain air or gas below atmospheric pressure (e.g., a partial vacuum) in the completed microelectronic structure. The subsurface voids 86, 88 are preferably buried at a depth within the isolation structures 42, 43 and beneath the top surface 40a of the dielectric layer 40 such that the subsurface voids 86, 88 remain sealed during subsequent processing steps.

Figure 5:
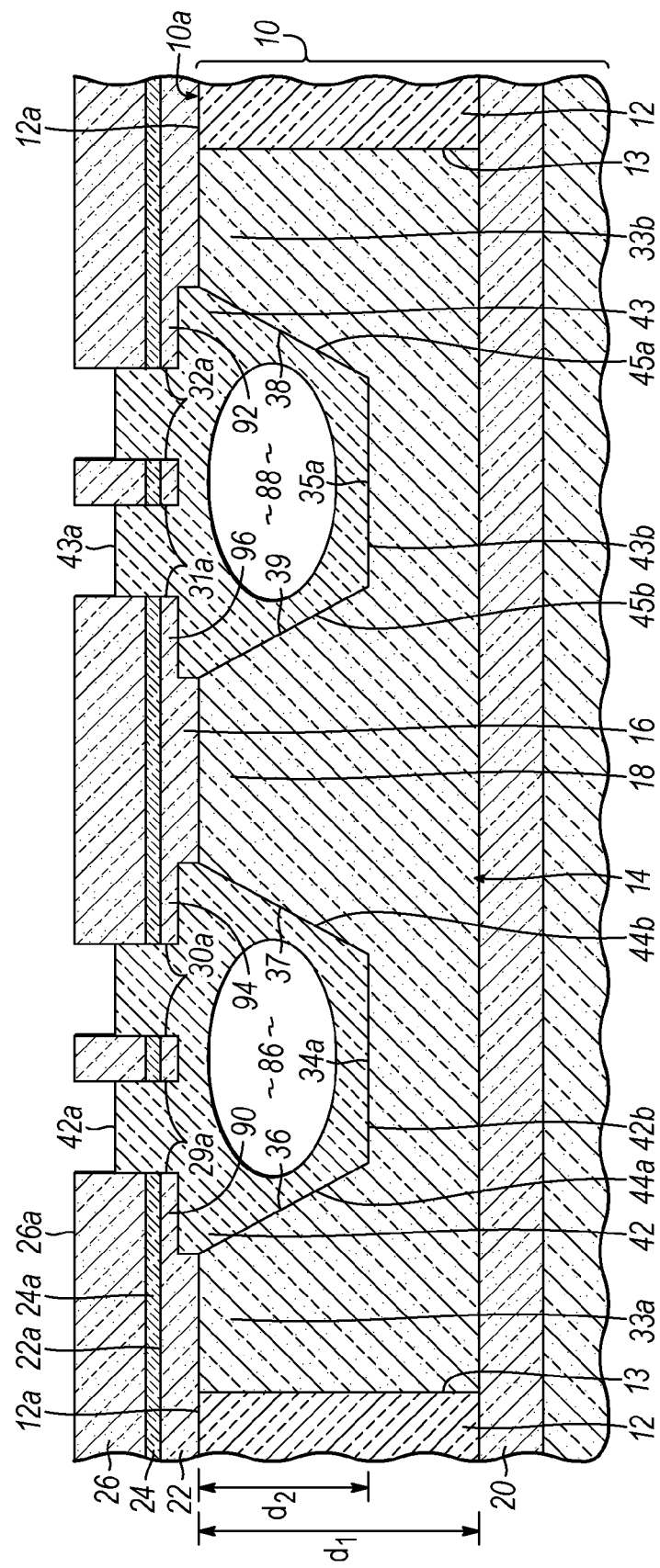

With reference to FIG. 5 in which like reference numerals refer to like features in FIG. 4 and at a subsequent fabrication stage of the processing method, the dielectric layer 40 is removed from the top surface 26a of the sacrificial layer 26, but not from within the trenches 34, 35, by a wet etching process or a dry etching process that may be end-pointed based upon exposure of the sacrificial layer 26 or may alternatively be timed. If the dielectric layer 40 is comprised of an oxide of silicon, then RIE or an oxide etch, such as buffered hydrofluoric acid or diluted hydrofluoric acid, may be employed to remove the dielectric layer 40 from the top surface 26a of sacrificial layer 26. The isolation structures 42, 43 of the dielectric layer 40 may be recessed relative to the top surface 26a of the sacrificial layer 26 but are not removed by the etching process.

The isolation structures 42, 43 reproduce the geometrical shape of the trenches 34, 35 within the device region 14 and are nominally identical to each other. Isolation structure 42 has a top surface 42a, a bottom surface 42b, and sidewalls 44a, 44b that are inclined at angle, α. Sidewall 44a is separated by the section 33a of the device region 14 from the interior sidewall 13 of the adjacent trench isolation structure 12. The sidewalls 44a, 44b of isolation structure 42 diverge in a direction toward the top surface 10a such that the width of the isolation structure 42 increases in a direction away from the bottom surface 42b. Isolation structure 43 has a top surface 43a, a bottom surface 43b, and sidewalls 45a, 45b that are inclined at angle, α. Sidewall 45a is separated by the section 33b of the device region 14 from the interior sidewall 13 of the adjacent trench isolation structure 12. The sidewalls 45a, 45b of isolation structure 43 diverge in a direction toward the top surface 10a such that the width of the isolation structure 43 increases in a direction away from the bottom surface 43b. At or slightly above the top surface 10a, the collector 18 has the width $w_2$ because of the inclined sidewalls 44b, 45b. The inclination of the sidewalls 44b, 45b of the isolation structures 42, 43 relative to the top surface 10a of the device region 14 may operate to reduce a surface area of a top surface of the collector 18 relative to a surface area of a contacting surface of a subsequently-formed intrinsic base that is in direct contact with the collector 18.

Isolation structures 42, 43 surround the collector 18 and, more specifically, sidewalls 44b, 45b are coextensive with (i.e., define a boundary of) the collector 18. The trench isolation structures 12 are not coextensive with the collector 18 and, instead, the isolation structures 42, 43 are laterally positioned between the trench isolation structures 12 and the collector 18. Hence, the trench isolation structures 12 do not define the boundaries of the collector 18.

In one embodiment, the isolation structures 42, 43 may comprise lengths of electrical insulator that are aligned parallel to each other. In this embodiment, the isolation structures 42, 43 do not define a closed geometrical shape. In an alternative embodiment, the isolation structures 42, 43 may join or may be joined by additional trenches so that the isolation structures 42, 43 surround or encircle the interior portion of the collector 18 to form a closed geometrical shape.

The shallow trench isolation structures 12 extend to a depth, $d_1$, measured relative to the top surface 10a of the substrate 10 and device region 14. The isolation structures 42, 43 and the trenches 34, 35 in which the isolation structures 42, 43 are formed extend to depth, $d_2$, measured relative to the top surface 10a of the substrate 10 and device region 14. The depth, $d_2$ is shallower than the depth, $d_1$. The depth difference facilitates the coupling of the sections 33a, 33b by the subcollector 20 with the collector 18 as the subcollector 20 can extend laterally beneath the isolation structures 42, 43 to provide the coupling.

Figure 6:
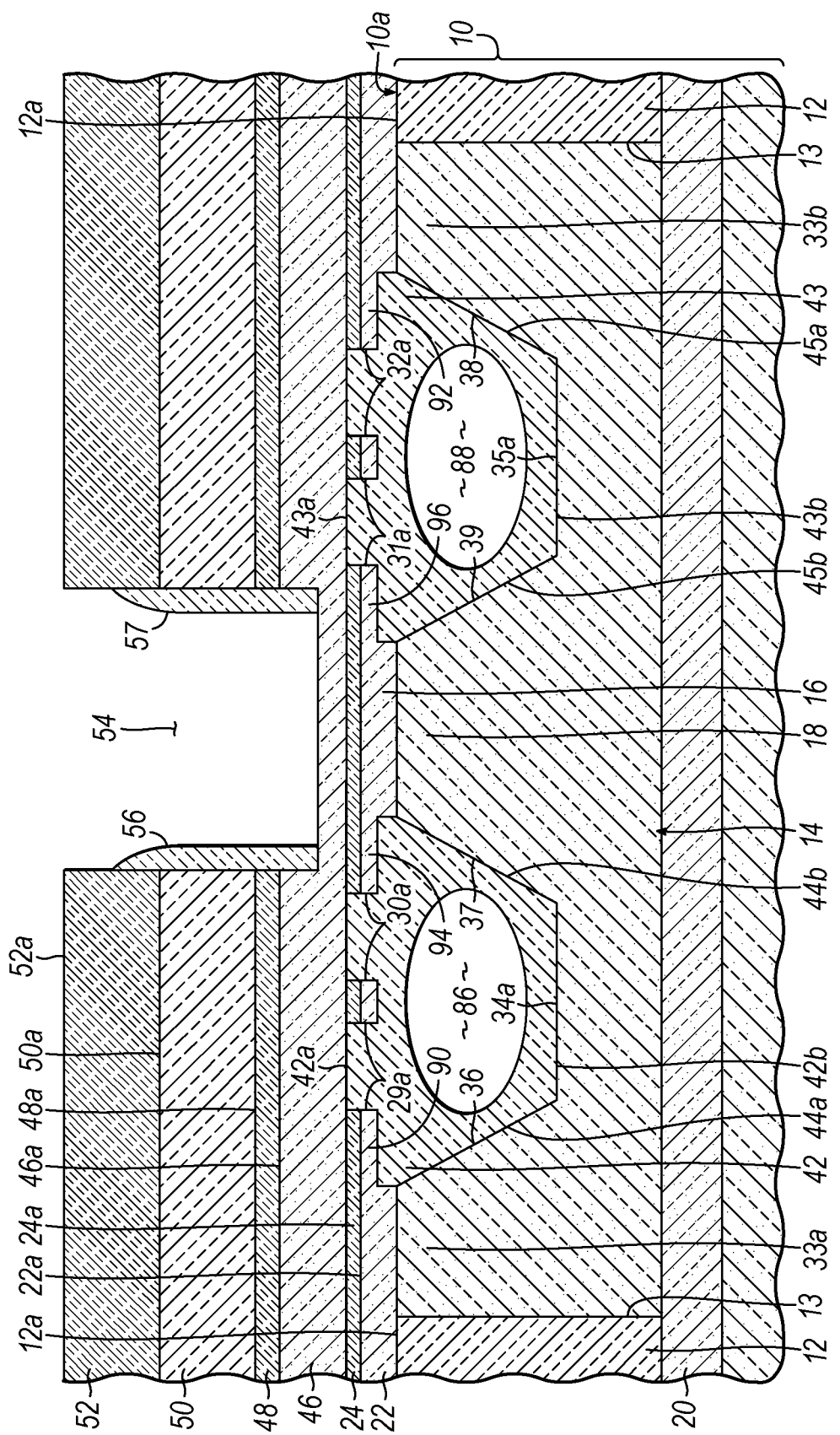

With reference to FIG. 6 in which like reference numerals refer to like features in FIG. 5 and at a subsequent fabrication stage of the processing method, the sacrificial layer 26 is removed by, for example, a wet etching process or a dry etching process. In particular, if the sacrificial layer 26 is comprised of polysilicon, the sacrificial layer 26 may be partially or completely removed by an etching process, such as a dry etching process or a wet etching process (e.g., an aqueous mixture of nitric acid ($HNO_3$) and hydrofluoric acid (HF)). The base dielectric layer 24 may operate as an etch stop for the removal of the sacrificial layer 26 if the materials comprising the sacrificial layer 26 and base dielectric layer 24 are selected such that the sacrificial layer 26 can be selectively etched relative to base dielectric layer 24. The base dielectric layer 24 is exposed in field regions surrounding the trenches 29-32.

An extrinsic base layer 46 is formed on the top surface 24a of the base dielectric layer 24. In one embodiment, the extrinsic base layer 46 may be comprised of polycrystalline semiconductor material (e.g., polysilicon or polycrystalline SiGe) deposited by CVD process. If the extrinsic base layer 46 is comprised of SiGe, the concentration of Ge may have a graded or an abrupt profile and may include additional layers, such as a Si cap. The extrinsic base layer 46 may be in situ doped with a concentration of a dopant, such as an impurity species from Group III of the Periodic Table (e.g., boron) effective to impart p-type conductivity. As a consequence of the deposition process and the non-crystalline nature of base dielectric layer 24 on which extrinsic base layer 46 is formed, the entire extrinsic base layer 46 is comprised of polycrystalline or amorphous semiconductor material.

Dielectric layers 48, 50, 52 are then formed in a stack on the extrinsic base layer 46. Dielectric layer 48, which is formed on a top surface 46a of extrinsic base layer 46, may directly contact the top surface 46a. Dielectric layer 50, which is formed on a top surface 48a of dielectric layer 48, may directly contact the top surface 48a. Dielectric layer 52, which is formed on a top surface 50a of dielectric layer 50, may directly contact the top surface 50a. Dielectric layer 48 and dielectric layer 52 may be comprised of the same electrical insulator, such as $SiO_2$ deposited by CVD. Dielectric layer 50 may be comprised of an electrical insulator, such as silicon nitride ($Si_3N_4$) deposited using CVD, with a different etch selectivity than dielectric layers 48, 52.

Dielectric layers 48, 50, 52 are patterned using photolithography and etching processes to define an opening 54 aligned with the collector 18. To that end, a patterned etch mask (not shown) is applied to the dielectric layer 52. In one embodiment, the etch mask may be a photoresist layer comprised of a sacrificial organic material applied by spin coating to the top surface 52a of dielectric layer 52. The photolithography process that patterns the photoresist layer exposes the photoresist to radiation imaged through a photomask and develops the resulting latent feature pattern in the exposed photoresist to define a window at the intended location for the opening 54. The etching process, which may be RIE, forms the opening 54 in the dielectric layers 48, 50, 52 by sequentially removing regions of each of the dielectric layers 48, 50, 52 unprotected by the etch mask. The etching process, which may be conducted in a single etching step or multiple steps, relies on one or more etch chemistries that remove the individual dielectric layers 48, 50, 52 and may comprise one or more discrete timed or end-pointed etches.

The opening 54 is extended by a controlled etching process, such as RIE, partially extended through the thickness of the extrinsic base layer 46. After etching, the top surface 46a of extrinsic base layer 46 is recessed (i.e., in a different plane) relative to a plane containing the top surface 46a of the extrinsic base layer 46 in masked regions. After the opening 54 is formed, the etch mask is removed. If comprised of photoresist, the etch mask may be removed by oxygen plasma ashing or chemical stripping.

Dielectric spacers 56, 57 are formed on the vertical sidewalls of the layers 46, 48, 50, 52 bounding the opening 54 and extend vertically to the base of the opening 54. The dielectric spacers 56, 57 may directly contact the recessed top surface 46a of extrinsic base layer 46. The dielectric spacers 56, 57 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

Figure 7:
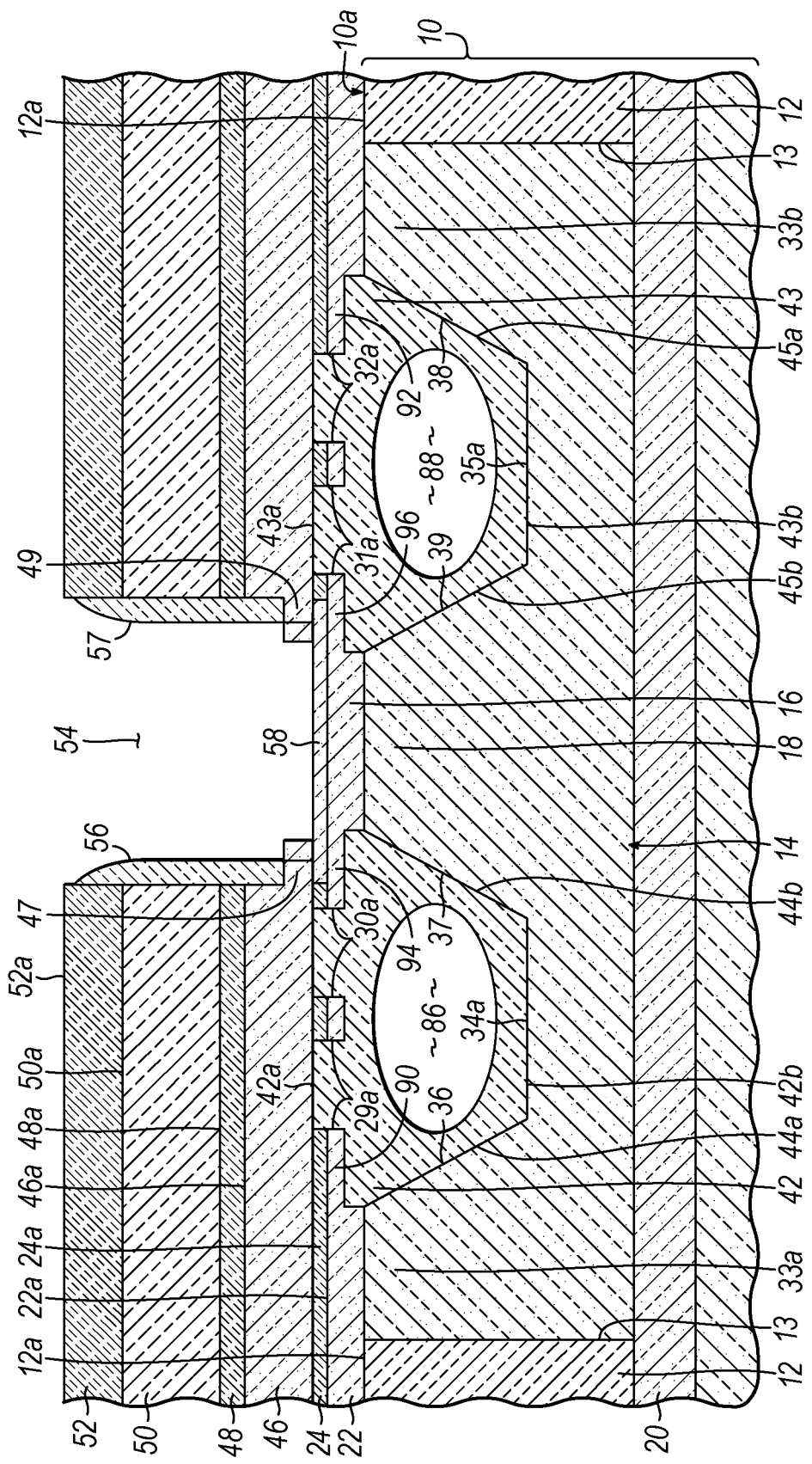

With reference to FIG. 7 in which like reference numerals refer to like features in FIG. 6 and at a subsequent fabrication stage of the processing method, the opening 54, as narrowed by the presence of the dielectric spacers 56, 57, is extended in depth completely through the raised region of extrinsic base layer 46 using an anisotropic etching process, such as RIE. The etching process removes the material of extrinsic base layer 46 selectively (e.g., at a higher etch rate) to the materials comprising the dielectric spacers 56, 57 and the base dielectric layer 24, and stops on the base dielectric layer 24. Unetched sections 47, 49 of extrinsic base layer 46 remain adjacent to the opening 54 and beneath the dielectric spacers 56, 57.

The opening 54 is then extended in depth through the base dielectric layer 24 by an isotropic etching process, such as a wet chemical etch, that stops on the intrinsic base layer 22. If the base dielectric layer 24 is comprised of $SiO_2$, the wet chemical etching process may use either dilute hydrofluoric (DHF) or buffered hydrofluoric (BHF) as an etchant. The removal of this region of base dielectric layer 24 exposes the top surface 22a of intrinsic base layer 22 over a portion of the interior section 16 and defines cavities between the sections 47, 49 of extrinsic base layer 46 and the intrinsic base layer 22. The isotropic etching process removes the material of base dielectric layer 24 selectively to the materials comprising the dielectric spacers 56, 57, the extrinsic base layer 46, and the intrinsic base layer 22.

A semiconductor layer 58 is formed as an additive layer on the top surface 22a of the intrinsic base layer 22 and, in the representative embodiment, is directly formed on the top surface 22a. The semiconductor layer 58 may be comprised of semiconductor material deposited or grown in an epitaxial relationship with the intrinsic base layer 22. The semiconductor material comprising the semiconductor layer 58 may be doped during or following deposition, or may be alternatively undoped. The semiconductor layer 58 may have a different composition than either the intrinsic base layer 22 or the extrinsic base layer 46. During the deposition process, the semiconductor material of semiconductor layer 58 nucleates on the semiconductor material of the intrinsic base layer 22 and acquires the crystalline state of the intrinsic base layer 22. Sections of the semiconductor layer 58 occupy the cavities between the sections 47, 49 of extrinsic base layer 46 and the intrinsic base layer 22. These sections define a link electrically and physically coupling the intrinsic base layer 22 and the extrinsic base layer 46 to provide a direct connection for current flow between the extrinsic base layer 46 and the intrinsic base layer 22. The semiconductor layer 58 may be considered to constitute a portion of the intrinsic base layer 22 and, subsequently, a portion of the intrinsic base 84 of the bipolar junction transistor 80 (FIG. 8).

With reference to FIG. 8 in which like reference numerals refer to like features in FIG. 7 and at a subsequent fabrication stage of the processing method, dielectric spacers 70, 71 and dielectric spacers 72, 73 are formed on the dielectric spacers 56, 57 with dielectric spacers 72, 73 intervening between dielectric spacers 70, 71 and dielectric spacers 56, 57. Dielectric spacers 72, 73 may be comprised of a dielectric material that is electrically insulating, such as $SiO_2$. Dielectric spacers 70, 71 may likewise be comprised of a dielectric material that is electrically insulating, such as $Si_3N_4$.

An emitter 74 of the bipolar junction transistor 80 is formed inside the opening 54. The emitter 74 may be formed from a layer of semiconductor material that is deposited and then patterned using lithography and etching processes. The lithography process may utilize photoresist and photolithography to form an etch mask that protects only a strip of the semiconductor material registered with the opening 54. An etching process that stops on the material of layer 50 is selected to fashion the emitter 74 from the protected strip of semiconductor material. The etch mask is subsequently removed.

The emitter 74 at least partially occupies the opening 54 and, in the representative embodiment, fully occupies the opening 54. The emitter 74 is electrically and physically coupled with the intrinsic base layer 22 by the semiconductor layer 58. The bottom part of the emitter 74, which is located inside the opening 54, directly contacts the top surface 58a of the semiconductor layer 58 and indirectly contacts the top surface 22a of intrinsic base layer 22 because the semiconductor layer 58 intervenes. A head of the emitter 74 protrudes out of the opening 54 and includes lateral arms that overlap with the top surface 50a of dielectric layer 50. The dielectric spacers 56, 57, and 70-73 encircle or surround the emitter 74 for electrically isolating the emitter 74 from the extrinsic base layer 46.

Dielectric layers 48, 50 are patterned using the same etch mask used to form the emitter 74, and an etching process, such as RIE, with suitable etch chemistries. The etch mask is subsequently removed. Layers 22, 24, 46 are then patterned with photolithography and etching processes to define an extrinsic base 82 and an intrinsic base 84 of the bipolar junction transistor 80 from the extrinsic base layer 46 and intrinsic base layer 22 separated by a section of the base dielectric layer 24. An etch mask is applied for use in a patterning process that relies on an etching process, such as RIE, with respective etch chemistries appropriate to etch the layers 22, 24, 46. Following the etching process, the etch mask is removed.

The emitter 74 of the bipolar junction transistor 80 may be formed from a layer of a heavily-doped semiconductor material that is deposited and then patterned using lithography and etching processes. For example, the emitter 74 may be comprised of polysilicon deposited by CVD or LPCVD and heavily doped with a concentration of a dopant, such as an impurities species from Group V of the Periodic Table, such as phosphorus (P), arsenic (As), to impart n-type conductivity. The heavy-doping level reduces the resistivity of the polysilicon and may be introduced by in situ doping that adds a dopant gas, such as phosphine or arsine, to the CVD reactant gases.

After patterning, the bipolar junction transistor 80 has a vertical architecture in which the intrinsic base 84 is located between the emitter 74 and the collector 18, and the emitter 74, the intrinsic base 84, and the collector 18 are vertically arranged. The conductivity types of the semiconductor material constituting the emitter 74 and the semiconductor materials constituting extrinsic base 82 and intrinsic base 84 are opposite. One p-n junction is defined at the interface between the emitter 74 and the intrinsic base 84. Another p-n junction is defined at the interface between the collector 18 and the intrinsic base 84.

The emitter 74 is electrically and physically coupled with the intrinsic base 84 by the semiconductor layer 58 across a surface area that is not impacted by the inclination of the respective interior sidewalls 44b, 45b of isolation structures 42, 43. As a result, the surface area across which the emitter 74 is indirectly coupled with the intrinsic base 84 may vary and be optimized independent of the surface area across which the collector 18 is directly coupled with the intrinsic base 84. In one embodiment, the surface area of a bottom surface of the intrinsic base 84 is larger than the coextensive area of a top surface of the collector 18 due to the inclination of the sidewalls 44b, 45b of the isolation structures 42, 43 relative to the top surface of the device region 14.

During the front-end-of-line (FEOL) portion of the fabrication process, the device structure of the bipolar junction transistor 80 is replicated across at least a portion of the surface area of the substrate 10. In BiCMOS integrated circuits, complementary metal-oxide-semiconductor (CMOS) transistors (not shown) may be formed using other regions of the substrate 10. As a result, both bipolar and CMOS transistors may be available on the same substrate 10.

Standard silicidation and standard back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 80, as well as other similar contacts for additional device structures like bipolar junction transistor 80 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

A contact 60 is coupled with the collector 18 by the subcollector 20 and sections 33a, 33b of the device region 14. The utilization of isolation structures 42, 43 defines the boundary of the collector 18 and provides the sections 33a, 33b of device region 14 that permits the collector 18 to be contacted inside the sidewall 13 (i.e., the inner perimeter) of the trench isolation structures 12. The extrinsic base 82 is contacted by a contact 62, and the emitter 74 is contacted by a contact 64. The intrinsic base layer 22 is not required to be formed on defective material of the intrinsic base layer 22 that overlies the top surface 12a of the shallow trench isolation structures 12. As a result, the intrinsic base layer 22 lacks a faceted region in the device area, which provides a smoother topology, an improved process window, a lower base resistance, and a lower collector resistance.

Figure 9:
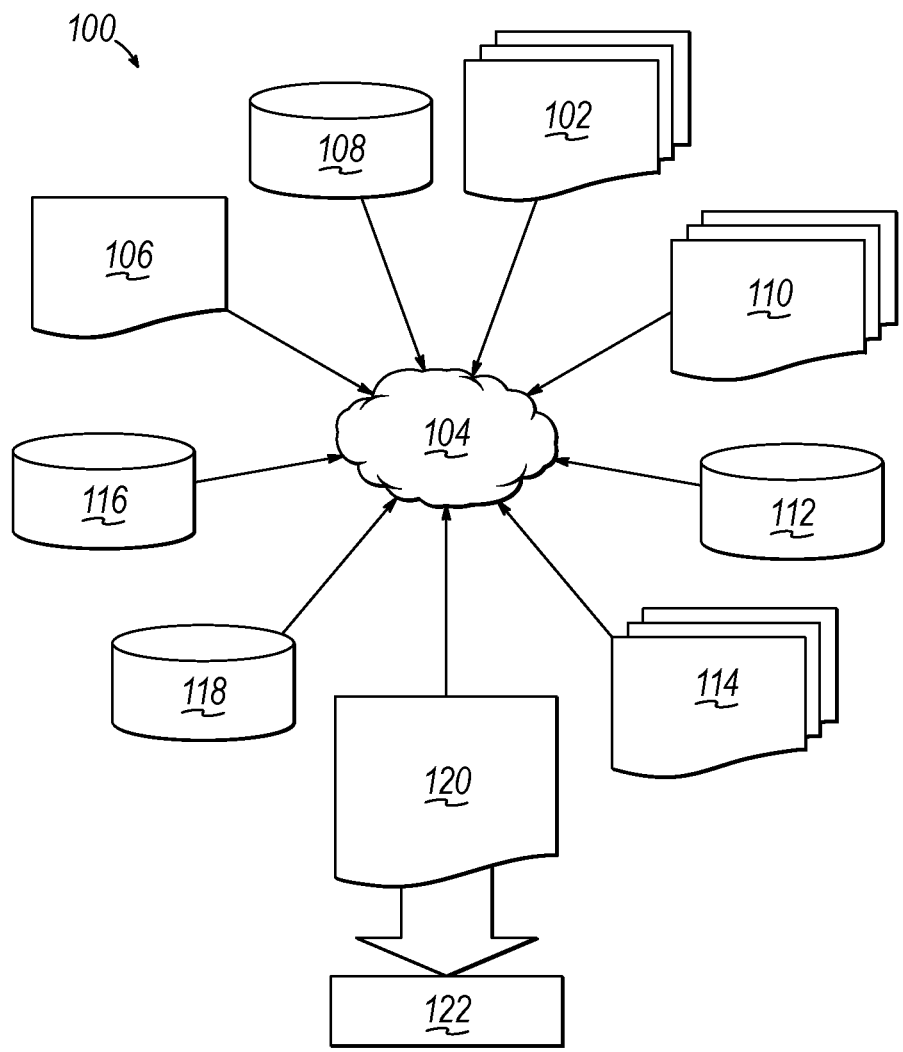
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 8 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 8. In one embodiment, design structure 120 may comprise a compiled, executable HDL simulation model that functionally simulates the devices shown in FIG. 8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
    forming a first isolation structure in a substrate to define a lateral boundary for a device region comprised of a semiconductor material of the substrate
    forming a collector in the device region of the substrate; and
    after the collector is formed, forming a second isolation structure in the device region that is laterally positioned relative to the first isolation structure between the collector and the first isolation structure to define a section of the device region between the first isolation structure and the second isolation structure.

2. The method of claim 1 comprising:
    before the second isolation structure is formed, forming an intrinsic base layer on the collector.

3. The method of claim 2 further comprising:
    after the second isolation structure is formed, forming an emitter coupled by the intrinsic base layer with the collector.

4. The method of claim 1 wherein the first isolation structure is formed before the second isolation structure is formed.

5. The method of claim 2 wherein forming the second isolation structure in the device region further comprising:
    using a first etching process, forming a plurality of first trenches extending through the intrinsic base layer and into the device region.

6. The method of claim 5 further comprising:
    etching the device region of the substrate bordering the first trenches with a second etching process that coalesces the first trenches to define a second trench; and
    depositing an electrical insulator to at least partially fill the second trench and define the second isolation structure.

7. The method of claim 6 wherein the device region adjacent to the first trenches is comprised of a semiconductor material that is single crystal, and the second etching process etches different crystallographic directions of the semiconductor material at different etch rates.

8. The method of claim 6 wherein the intrinsic base layer comprises a first stratum adjacent to the collector and a second stratum separated from the collector by the first stratum, the first stratum and the second stratum comprised of respective semiconductor materials having different compositions, and the second etching process removes the first stratum selective to the second stratum.

9. The method of claim 5 wherein forming the second isolation structure in the device region further comprising:
    forming a plurality of second trenches each extending through the intrinsic base layer and into the device region,
    wherein the second trenches are separated from the first trenches by the collector.

10. The method of claim 9 wherein the second trenches are formed by the first etching process, the second trenches are coalesced by the second etching process to define a third trench, and the electrical insulator to at least partially fill the third trench and define a third isolation structure separated from the second isolation structure by the collector.

11. The method of claim 1 comprising:
    forming a subcollector in the device region that laterally extends beneath the second isolation structure to couple the collector with the section of the device region.

12. The method of claim 11 further comprising:
    forming a contact coupled by the section of the device region with the subcollector.

* * * * *